(12) United States Patent
Sharon et al.

(10) Patent No.: US 11,727,984 B2
(45) Date of Patent: Aug. 15, 2023

(54) DETECTION OF PAGE DISCREPANCY DURING READ THRESHOLD CALIBRATION

(71) Applicant: Western Digital Technologies, Inc., San Jose, CA (US)

(72) Inventors: Eran Sharon, Rishon Lezion (IL); Karin Inbar, Ramat Hasharon (IL); Alexander Bazarsky, Holon (IL); Dudy David Avraham, Even Yehuda (IL); Rohit Sehgal, San Jose, CA (US); Gilad Koren, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 109 days.

(21) Appl. No.: 17/184,536

(22) Filed: Feb. 24, 2021

(65) Prior Publication Data

US 2022/0199156 A1 Jun. 23, 2022

Related U.S. Application Data

(60) Provisional application No. 63/130,077, filed on Dec. 23, 2020.

(51) Int. Cl.
*G11C 16/26* (2006.01)
*G11C 11/56* (2006.01)

(52) U.S. Cl.
CPC ...... *G11C 11/5642* (2013.01); *G11C 11/5671* (2013.01); *G11C 16/26* (2013.01)

(58) Field of Classification Search
CPC .................................................. G11C 16/26
USPC ..................................................... 365/185.03
See application file for complete search history.

(56) References Cited

U.S. PATENT DOCUMENTS

2020/0133570 A1* 4/2020 Shadmi ................ G06F 3/0659

\* cited by examiner

*Primary Examiner* — Alfredo Bermudez Lozada
(74) *Attorney, Agent, or Firm* — Patterson + Sheridan, LLP; Steven H. VerSteeg

(57) ABSTRACT

Data storage devices, such as solid state drives (SSDs), are disclosed. A read threshold calibration operation is utilized to generate a calibrated read threshold for one or more voltage states of a cell of a MLC memory. A single-level cell (SLC) read is then executed to sense the ratio of bit values at the read thresholds of the voltage states, where SLC read refers to reading at a single read threshold, rather than to the cell type. The sensing results in a binary page with certain statistics of 1's and 0's. The ratio of 1's (or 0's) in the binary page is used to determine a deviation from the expected ratio, where the deviation is used to adjust the calibrated read threshold to match the voltage states of the MLC memory.

13 Claims, 6 Drawing Sheets

DETECTION OF PAGE DISCREPANCY DURING READ THRESHOLD CALIBRATION

CROSS-REFERENCE TO RELATED APPLICATIONS

This application claims benefit of U.S. provisional patent application Ser. No. 63/130,077, filed Dec. 23, 2020, which is herein incorporated by reference.

BACKGROUND OF THE DISCLOSURE

Field of the Disclosure

Embodiments of the present disclosure generally relates to data storage devices, such as solid state drives (SSDs).

Description of the Related Art

Data storage devices often include one or more flash memory devices. Each of the one or more flash memory devices have allowed for the greater portability and the storage of data, while maintaining or decreasing the size of the data storage device. Flash memory devices may enhance a data storage density by storing multiple bits in each flash memory cell. For example, a multi-level cell (MLC) scheme may be commonly used as the flash memory device, such that several bits are stored in a single flash memory cell. In the example of a MLC flash memory, 2 bits are stored in a single flash memory cell.

The MLC scheme involves a mapping such that when several read thresholds are sensed, the read threshold results are not exclusive or'ed (NXORed) to produce the logical page. However, a potential problem may arise from reading a lower page (LP) as an upper page (UP) in mappings that have the same number of thresholds. During the read threshold calibration operation, the storage device may read the LP instead of the UP, and return read thresholds that fit the LP for the UP. The error correction code (ECC) decoder would then read the LP as an UP without detecting a problem, resulting in a mis-compare. In some examples, a program failure may cause a neighbor plane disturb (NPD), where the distribution of cells on the NPD plane may manifest in such a way that when sensing an UP, LP data is returned or vice-versa.

Thus, there is a need in the art for an improved detection of bit values of the logical pages when performing read threshold calibrations.

SUMMARY OF THE DISCLOSURE

The present disclosure generally relates to data storage devices, such as solid state drives (SSDs). A read threshold calibration operation is utilized to generate a calibrated read threshold for one or more voltage states of a cell of a MLC memory. A single-level cell (SLC) read is then executed to sense the ratio of bit values at the read thresholds of the voltage states, where SLC read refers to reading at a single read threshold, rather than to the cell type. The sensing results in a binary page with certain statistics of 1's and 0's. The ratio of 1's (or 0's) in the binary page is used to determine a deviation from the expected ratio, where the deviation is used to adjust the calibrated read threshold to match the voltage states of the MLC memory.

In one embodiment, a data storage device comprises a non-volatile storage unit. A capacity of the non-volatile storage unit is divided into a plurality of cells. Each of the plurality of cells includes one or more pages. The data storage device further comprises a controller coupled to the non-volatile storage unit. The controller is configured to sense a statistic of the one or more pages at an expected read threshold, where the sensing is a single-level cell (SLC) read at the expected read threshold, compare the sensed statistic of the one or more pages to an expected statistic of the one or more pages, and adjust, based on a deviation from the expected statistic, a calibrated read threshold of the read threshold calibration.

In another embodiment, a data storage device comprises a non-volatile storage unit. A capacity of the non-volatile storage unit is divided into a plurality of cells. Each of the plurality of cells includes one or more pages. The data storage device further comprises a controller coupled to the non-volatile storage unit. The controller is configured to initiate a read threshold calibration operation, analyze results of the read threshold calibration operation to determine one or more calibrated read thresholds, sense a ratio of bit values of at least one or more single read thresholds, calculate a statistic, based on the sensing, of the one or more pages, where a sensed statistic is a fraction of a first number of first bit values or a fraction of a second number of second bit values, determine if the sensed statistic is within an acceptable range from an expected statistic, generate an alert if the sensed statistic is outside the acceptable range from the expected statistic, and adjust, based on a deviation from the expected statistic, the one or more calibrated read thresholds of the read threshold calibration operation.

In another embodiment, a data storage device comprises a non-volatile storage unit. A capacity of the non-volatile storage unit is divided into a plurality of cells. Each of the plurality of cells includes one or more pages. The data storage device further comprises a controller coupled to the non-volatile storage unit. The controller is configured to sense a statistic of the one or more pages prior to performing a read threshold calibration operation, where the statistic is a ratio of a first number of first bits to a total number of bits, and where the total number of bits comprises the first number of first bits and a second number of second bits, determine if the sensed statistic is within an acceptable range from an expected statistic, generate an alert if the sensed statistic is outside the acceptable range from the expected statistic, where the controller performs, in response to the alert, at least one of the following: repeat the read threshold calibration operation utilizing modified sensing parameters, adjust one or more scanning combs of the read threshold operation, and relocate recoverable data from the one or more pages, and adjust, based on a deviation from the expected statistic, the one or more calibrated read thresholds of the read threshold calibration operation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as solid state drives (SSDs). A read threshold calibration operation is utilized to generate a calibrated read threshold for one or more voltage states of a cell of a MLC memory. A single-level cell (SLC) read is then executed to sense the ratio of bit values at the read thresholds of the voltage states, where SLC read refers to reading at a single read threshold, rather than to the cell type. The sensing results in a binary page with certain statistics of 1's and 0's. The ratio of 1's (or 0's) in the binary page is used to determine a deviation from the expected ratio, where the deviation is used to adjust the calibrated read threshold to match the voltage states of the MLC memory.

Figure 1:
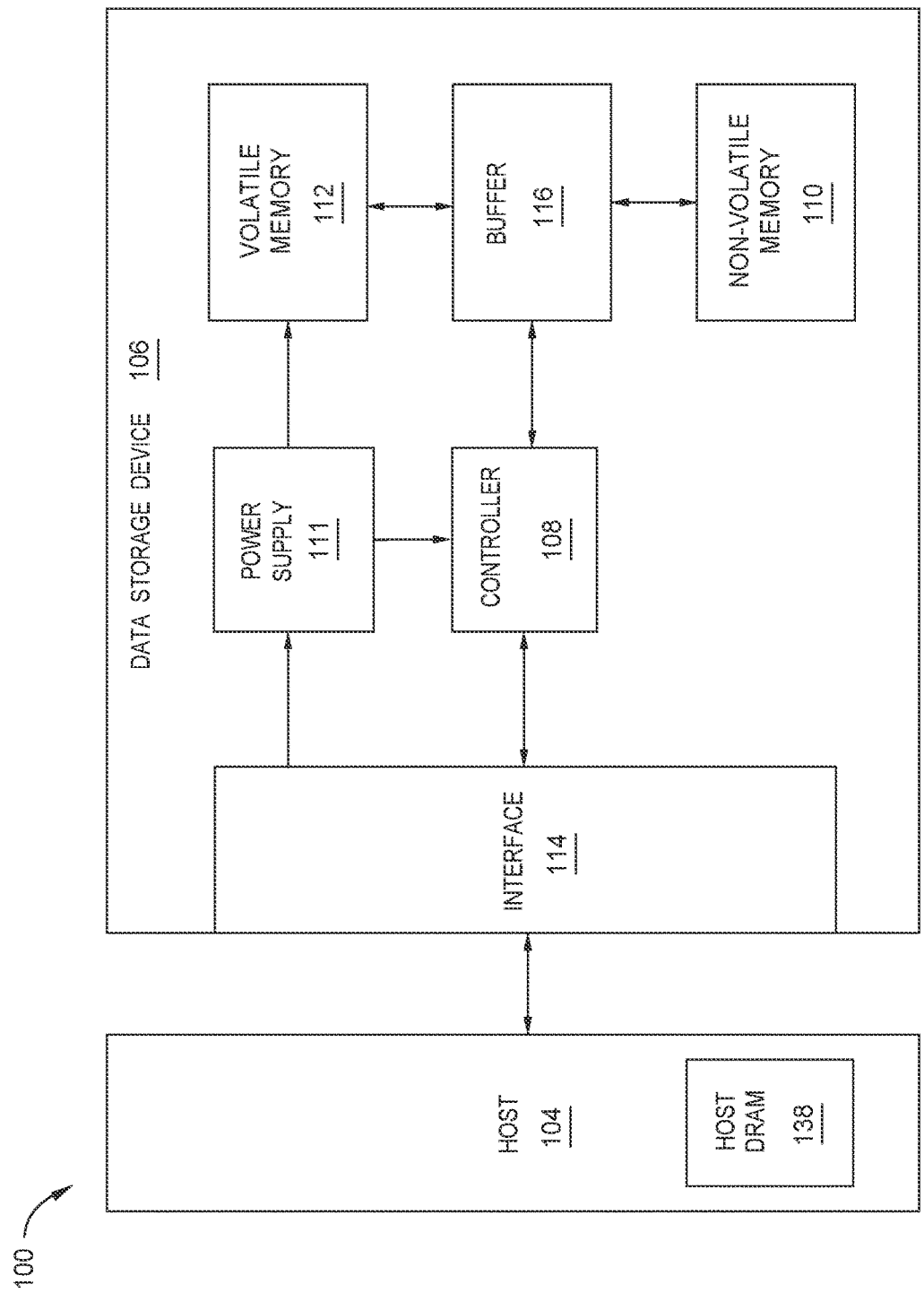
FIG. 1 is a schematic block diagram illustrating a storage system in which data storage device may function as a storage device for a host device, according to disclosed embodiments.

FIG. 1 is a schematic block diagram illustrating a storage system 100 in which data storage device 106 may function as a storage device for a host device 104, according to disclosed embodiments. For instance, the host device 104 may utilize a non-volatile storage unit, such as a non-volatile memory (NVM) 110, included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, a single physical chip may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some examples, the controller 108 may use volatile memory 112 as a cache. For instance, the controller 108 may store cached information in volatile memory 112 until cached information is written to non-volatile memory 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory or write buffer 116 before sending the data to the NVM 110.

Figure 2A:
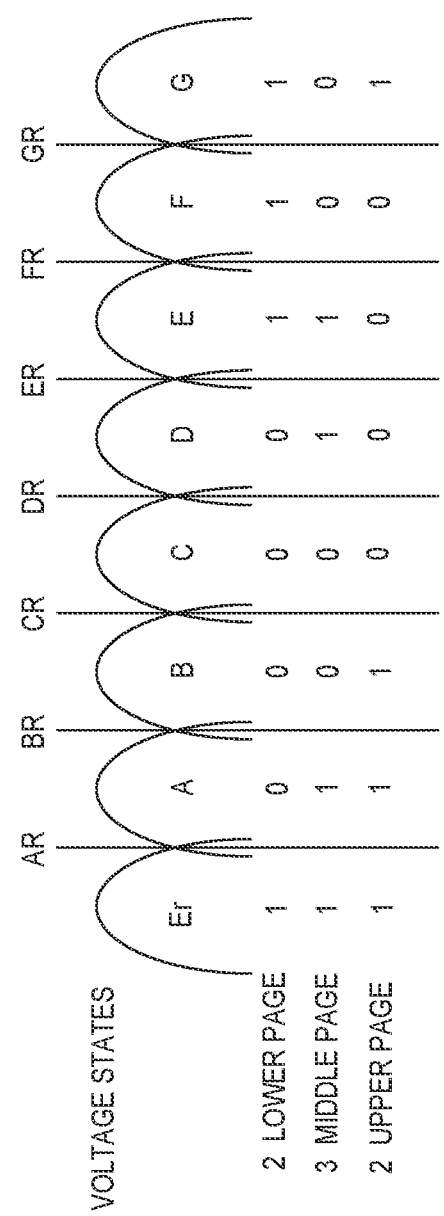
FIG. 2A is a schematic illustration of a combination of bit values for each voltage state of a triple-level cell (TLC) memory, according to disclosed embodiments.

FIG. 2A is a schematic illustration of a combination of bit values for voltage states of a triple-level cell (TLC) memory, according to disclosed embodiments. The TLC memory may be the NVM 110 of FIG. 1, in some embodiments. Each cell of the TLC memory has eight voltage states, where one of the eight voltage states is an erased state (Er). The number of voltage states of a multiple level cell memory may be calculated by two raised to the power of number of pages (i.e., levels) of a cell. For example, a cell of the TLC memory has 3 pages, an upper page, a middle page, and a lower page. The total number of voltage states is $2^3$ voltage states or 8 voltage states. It is to be understood that while TLC memory is exemplified in the embodiments herein, other memories, such as MLC, PLC, and the like, are contemplated and the aspects described herein are applicable to those embodiments contemplated.

Each of the voltage states are defined by a combination of bit values for the pages that make up the voltage states. Each page has either a first bit value or a second bit value, where a first bit value may correspond to a logical "1" and a second bit value may correspond to a logical "0", or vice versa. When each page of a voltage state has a logical "1" value, such as the voltage state "Er", the voltage state is considered to be erased or containing no data. However, when at least one of the pages includes a logical value of "0", the voltage state is considered to be programmed or containing data, such as the voltage states "A", "B", "C", "D", "E", "F", and "G".

Figure 2B:
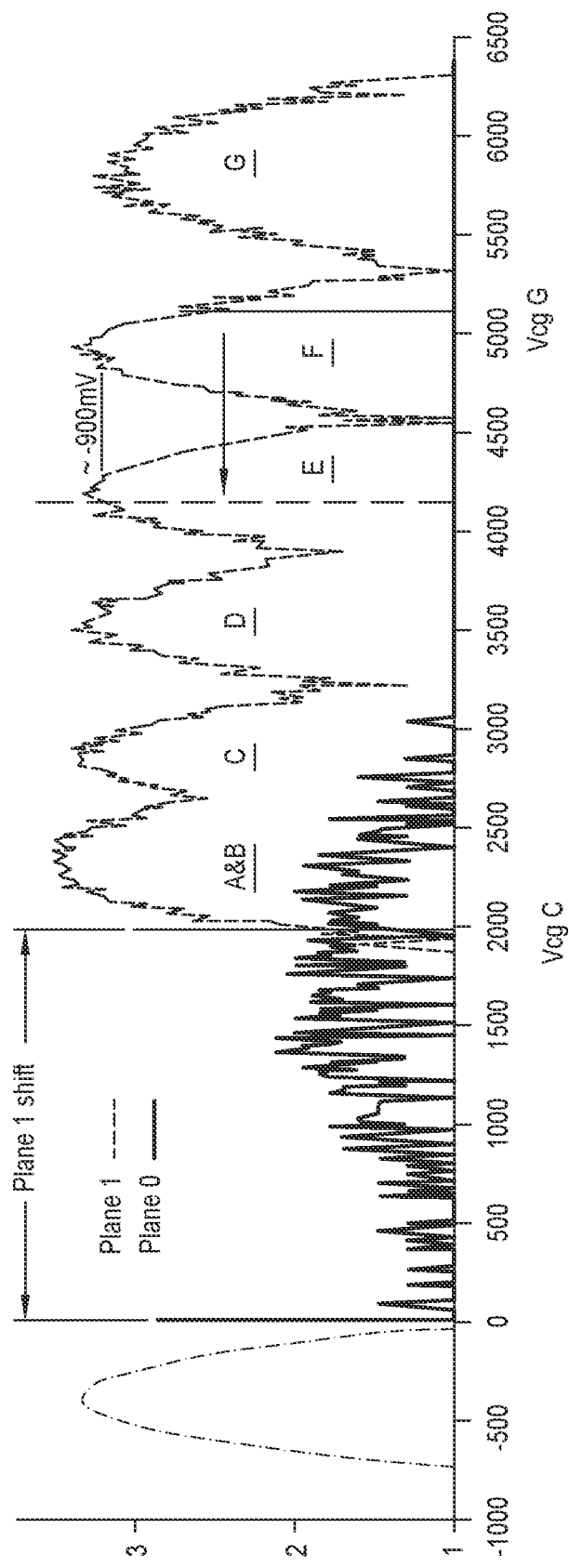
FIG. 2b is a schematic illustration of a voltage shift of a plane due to a neighboring plane disturb, according to disclosed embodiments.

FIG. 2B is a schematic illustration of an example voltage shift of a plane due to a neighboring plane disturb, according to disclosed embodiments. In the example scenario of FIG. 2B, during operation of a data storage device, such as the data storage device 106 of FIG. 1, Plane0 has a program failure, such that the voltage states of Plane0 are not distributed. The program failure on Plane0 may cause a neighbor plane disturb (NPD) on a neighboring plane, such as Plane1. Because of the NPD on Plane1 from Plane0, the voltage stages are shifted to the right (i.e., in the positive voltage direction).

When the controller, such as the controller 108 of FIG. 1, attempts to read the "C" voltage state, indicated by Vcg_C at 2,000 mV, the "A" voltage state is returned instead due to the NPD effect on Plane1. Thus, reading the upper page of the "C" voltage state may result in the reading of the lower page of the "A" voltage state because the bit values of the lower pages of the "Er" to "A" voltage states (e.g., 1 and 0, respectively) matches the bit values of the upper page of the "B" to "C" voltage states (e.g., 1 and 0, respectively). Likewise, reading the lower page of the "E" voltage state may result in the reading of the upper page of the "G" voltage state because the bit values of the lower page of the "D" to "E" voltage states (e.g., 0 and 1, respectively) matches the bit values of the upper page of the "F" to "G" voltage states (e.g., 0 and 1, respectively).

In order to recover data due to full block failure, the XOR parity for the current and recently programmed data may be stored in the DRAM, and the data on the failed block may be recovered using the XOR parity. The plane failure (PF) recovery may be designed to make use of the XOR parities to recover the data of the failed plane. When a scenario, such as the scenario described in FIG. 2B, where a PF occurs on one plane (e.g., Plane0) and causes a NPD on the other plane (e.g., Plane1), the controller may attempt to decode, such as error correction code (ECC) decoding, the data on the NPD plane. Because parity data may be striped across planes, the decoded parity data on the NPD plane may be required to recover the PF plane.

However, because of the NPD on the neighboring plane, the voltage state distribution may be shifted in a positive voltage direction, such as the Plane1 shift illustrated in FIG. 2B, or in a negative voltage direction. In some embodiments, the voltage state distribution shift may occur due to silent program failures. Because of the voltage state distribution, the controller may find the optimum read level in order to minimize or correct the number of bits in error to successfully decode the NPD plane. When executing a read intended to be completed at the "CR" and the "GR" read thresholds (i.e., between the "B" and the "C" states and between the "F" and the "G" states, respectively), the read would instead be completed at the "AR" and the "ER" read thresholds (i.e., between the "ER" and the "A" states and between the "D" and the "E" states, respectively). Referring to FIG. 2B, the GR read level (Vcg_G) may be shifted to the max left value of 900 mV, indicated by the arrow pointing in the negative voltage direction, to remedy the voltage state distribution shift. The shift may result in a read intended to be done at the "CR" and "GR" read levels to appear at the "AR" and "ER" read levels. Therefore, an upper page read would return the lower page data, and the error may be undetectable by the LDPC decode operation. For example, the "GR" read level is shifted by about 900 mV, where reading at the expected read threshold of the "GR" voltage is actually performed between states "D" and "E", rather than between states "G" and "F". Therefore, an upper page read would return lower page data and be undetectable by the ECC decode.

Figure 3:
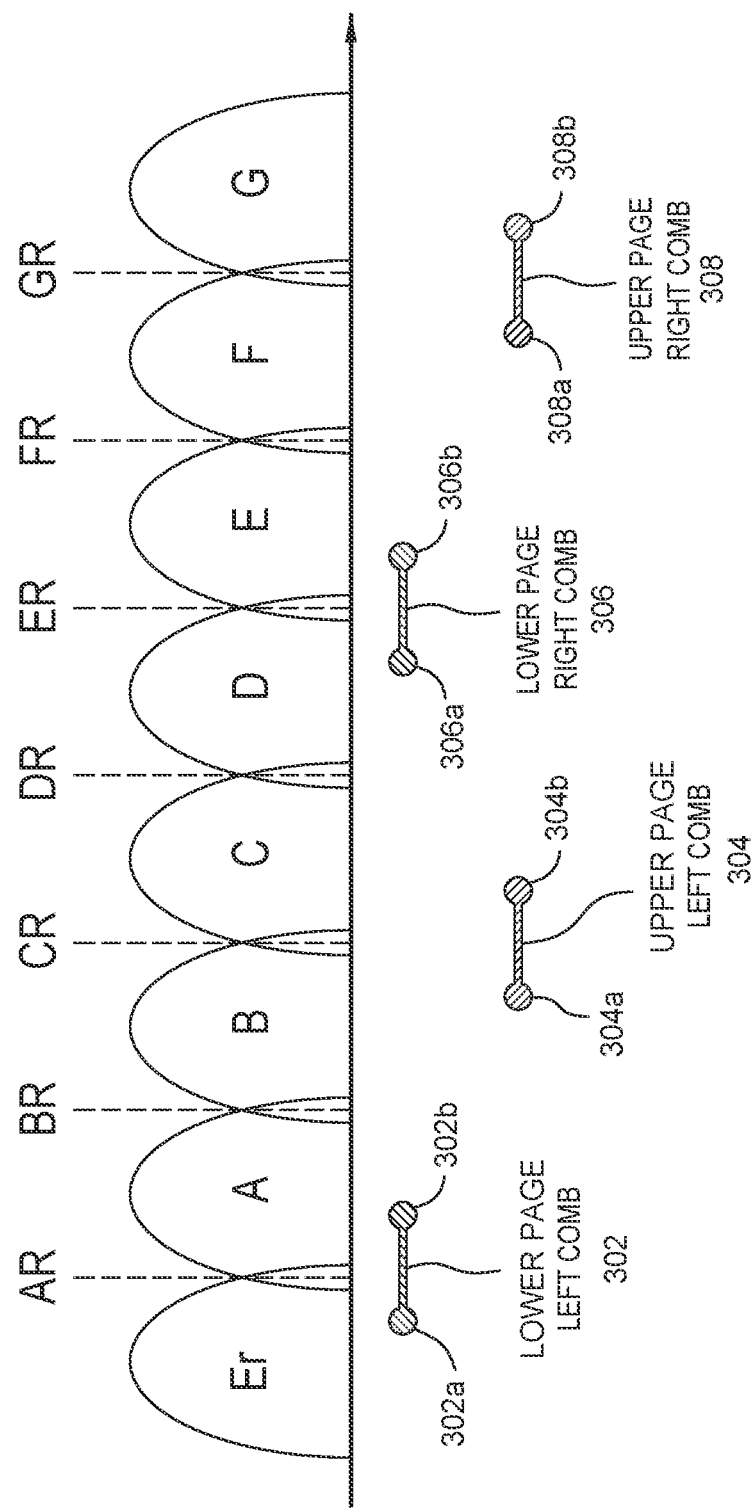
FIG. 3 is a schematic illustration of a read threshold calibration process and a proposed single-level cell (SLC) read at various read thresholds for shifted state voltage distributions detection, according to disclosed embodiments.

FIG. 3 is a schematic illustration of a read threshold calibration process and a proposed single-level cell (SLC) read at various read thresholds for shifted state voltage distributions detection, according to disclosed embodiments. As used herein, a SLC read refers to reading at a single read threshold, rather than to the cell type. Read threshold calibrations may be completed by performing multiple reads by scanning a read voltage (Vcg) range (referred to as a scanning "comb" herein). The scanning range (or the scanning comb) is determined according to the maximum expected voltage shift for a "normal" page (i.e., a page with non-defective wordlines (WLs)) under the various operational conditions. The various operational conditions for a "normal" page may be based on the memory specifications for endurance, retention, and operational temperatures. Furthermore, within the scanning comb, the read thresholds, which may minimize the bit error rate (BER), may be determined as the optimal read thresholds. In order to ensure that the determined optimal read thresholds correspond to the correct page, rather than to a different page due to rare disturb conditions, such as a neighboring plane disturb, an additional SLC read is performed.

The SLC read at various read thresholds may be part of the read threshold calibration algorithm or operation to generate calibrated read thresholds. In one embodiment, the sense operation of the SLC read is performed at one of the read thresholds returned by the read thresholds calibration algorithm applied to the target page. The results of the SLC read operation are then compared to the expected results corresponding to the target page. The results of the SLC read operation may be referred to as statistics, where the statistics are the number of logical "1's" and the number of logical "0's". When the statistics are not as expected (i.e., do not correspond to the expected results corresponding to the target page), a problem with the read thresholds is detected and the controller, such as the controller 108 of FIG. 1, is alerted to take appropriate countermeasures.

In another embodiment, detection of the problem is to be completed prior to applying the read thresholds calibration algorithm, such as during read threshold calibration operation. In such an embodiment, the SLC read operation may be performed on the edges of one of the scanning combs of the read thresholds of the target page being calibrated. In one example where the statistics of the SLC read operation are not as expected for the target page, a problem with the scanning combs is detected and the current read thresholds calibration operation is aborted in order to avoid retrieving read thresholds for the wrong page (i.e., a different page than the target page). For example, in the TLC memory, bit values of the lower pages of the "Er" to "A" voltage states (e.g., 1 and 0, respectively) matches the bit values of the upper page of the "B" to "C" voltage states (e.g., 1 and 0, respectively). Because the bit values of the lower pages and the bit values of the upper pages match, a NPD may shift the voltage state distribution and cause the controller to scan for the lower page read thresholds around the upper page read thresholds, or vice versa, which may result in finding read thresholds corresponding to a different page rather than the target page.

The SLC read operation generates a binary page. For example, for each cell that has a voltage less than the SLC read level (i.e., cell's Vt<Vcgr_SLC) are read as "1's" and each cell that has voltage greater than the SLC read level (i.e., cell's Vt>Vcgr_SLC) are read as "0's". When completing the sense operation (i.e., the SLC read operation), the bit ratio of the resulting binary page is determined. A bit ratio of the number of bits, read as "0's" or "1's", to the total number of bits found during a SLC read is compared to the expected bit ratio of the number of bits, read as "0's" or "1's", to the total number of bits of the target page (i.e., the page of the read threshold calibration operation).

For example, when performing a read threshold calibration for the lower page of a TLC memory, such as the TLC memory whose scanning comb is shown in FIG. 3, the SLC read operation or sensing is performed at two different read levels, "AR" and "ER". The "AR" read level is between the "ER" and the "A" states, and the "ER" read level is between the "D" and the "E" states. The read threshold calibration includes scanning two voltage combs, one around the expected location of the "AR" read level and the other around the expected location of the "ER" read level. For instance, the lower page left comb 302 illustrates the expected location of the "AR" read level and the lower page right comb 306 illustrates the expected location of the "ER" read level.

In order to confirm that the read threshold calibration operation found and returned the optimal read levels of the lower page, rather than the read levels of the upper page due to a disturb effect, a SLC read may be performed. According to one example, the SLC read may be performed after the read threshold calibration operation is completed in order to verify the results of the completed read threshold calibration operation. The SLC read operation may be performed at the "AR" read level returned by the read threshold calibration operation. When performing the SLC read operation at the "AR" read level, approximately about ⅛, or about 12.5%, of the cell are read as logical "1's" and about ⅞, or about 87.5%, of the cells are read as logical "0's".

When a significant deviation in the fraction or percentage of cells that are read as logical "1's" is observed, such as when the fraction of logical "1's" is greater than about 18.75%, then the controller is alerted that a problem has been identified and corrections may be needed to rectify the problem. In another example, the SLC read may be performed at the "ER" read level returned by the read threshold calibration operation. The SLC read completed at the "ER" read level may result in about ⅝, or about 62.5% of the cells to be read as logical "1's". When a significant deviation in the fraction of cells that are read as logical "1's" is observed, such as when the fraction or percentage of logical "1's" is greater than about 68.75% or less than about 56.25%, then the controller is alerted that a problem has been identified and corrections may be needed to rectify the problem. The previously listed values are not intended to be limiting, but to provide an example of a possible embodiment.

In another example, the SLC read operation may be performed before the read threshold calibration operation is completed, or prior to the read threshold calibration operation, in order to ensure that the scanning range (i.e., scanning combs) includes the read thresholds of the target page, rather than the read thresholds of a wrong page due to a read disturb condition. By executing the SLC read operation during the read threshold calibration operation, problems or issues concerning the read disturb conditions may be identified and rectified during the read threshold calibration operation, rather than after the read threshold calibration is completed. Continuing with the example described above for the lower page read threshold calibration, the SLC read operation may be performed at the right most edge 302b of the lower page left comb 302. The objective of the SLC read is to verify that the read threshold of the wrong page, such as the upper page at the "CR" read threshold, is not included within the scanning comb. The expected logical "1's" fraction or percentage at the "CR" read threshold is about ⅜, or about 37.5%.

Verification of the lower page left comb 302 SLC read operation may be a logical test to confirm that the number of logical "1's" of the lower page left comb 302 is much less than the lower threshold of the upper page left comb 304. For example, the lower threshold of the upper page left comb 304 may be about 31.25%, such that the number or percentage of logical "1's" of the lower page left threshold of less than about 31.25% confirms that the "CR" read threshold is not in the scanning window. In another example, the SLC read operation may be performed on the right most edge 302b of the upper page right comb 308 to ensure that the correct read thresholds are returned for the upper pages and the lower pages. For example, a read at the "GR" read threshold may result in the fraction or percentage of logical "1's" to be about ⅞, or about 87.5%. When the fraction of logical "1's" is less than a lower threshold value of the upper page right comb 308, such as about 81.25%, the SLC read operation for a lower page may be verified.

The controller may compare the results of the SLC read with a range of "verify conditions". The "verify conditions" refer to a confirmation of the appropriate bit value fractions (or absolute number or any other statistics) for that read. Table 1 below describes the different SLC read thresholds and the respective verify conditions that may be used for verifying the scanning ranges utilized by the read threshold calibration operation of the lower page and the upper page. It is to be understood that the range of verify conditions is not intended to be limiting, but to provide an example of a possible embodiment.

TABLE 1

| Page | SLC Read Threshold | Verify Condition |
| --- | --- | --- |
| Lower | Most right edge of left comb | "1's" Fraction <31.25% |
| Lower | Most right edge of right comb | "1's" Fraction <81.25% |
| Upper | Most left edge of left comb | "1's" fraction >18.75% |
| Upper | Most left edge of right comb | "1's" Fraction >68.75% |

The thresholds against which the fraction or percentage of logical "1's" is compared to may be determined in a way that leaves a margin for variations in the number of cells per state. For example, the first verify condition for the lower page shown in Table 1 above is set to less than about 81.25%, rather than less than about ⅞ or about 87.5%. More rigorously, assuming storage of random data, or alternatively applying customary scrambling operations to randomize the data prior to storage, the expected cells per each state of a TLC memory is about ⅛. However, the previously described value is an expected value and variations of the value may exist. For random data, or optimally scrambled data, stored on a wordline including "N" cells, the number of cells per state is expected to be $$\mu = \frac{N}{8}$$

and the standard deviation is $$\sigma = \sqrt{N * \left(\frac{1}{8}\right) * \left(\frac{7}{8}\right)}.$$

Hence, when performing a SLC read at the "j" read level, such as when "j" equals 1, "j" refers to the "AR" read level, the resulting binary page should return the following statistics:

$$\mu_j = \frac{j * N}{8}, \sigma_j = \sqrt{N * \left(\frac{j}{8}\right) * \left(\frac{7-j}{8}\right)}.$$

Likewise, in terms of fractions, the binary page should have the following statistics:

$$\mu_j[\%] = \frac{j}{8}, \sigma_j[\%] = \sqrt{\left(\frac{1}{N}\right) * \left(\frac{j}{8}\right) * \left(\frac{7-j}{8}\right)}.$$

In one embodiment, the thresholds against which the fraction of logical "1's" are compared to may be determined by taking a number of standard deviations from the expected threshold value, where the number of standard deviations may be between about 5 standard deviations and about 10 standard deviations.

In another example, verification may be performed in order to ensure that the optimal read threshold of the target page is included within the scanning comb, rather than verifying that the read threshold of the wrong page is not included within the scanning comb, as described above. For example, referring to FIG. 3, verifying that the lower page left comb 302 includes the "AR" read threshold may be performed by performing two SLC reads, one at the left most edge 302a of the scanning comb (resulting in fraction of 1's=f_L) and one at the right most edge 302b of the scanning comb (resulting in fraction of 1's=f_R). Then, verification may be performed to ensure that f_L<12.5%−n·σ and f_R>12.5%+n·σ, where "n" refers to a number of standard deviations. The verification may ensure that the optimal read threshold of the target page is included within the scanning comb.

When a verify condition mismatch is found, such as having a bit ratio of about 33% is found when a verify condition of about less than or equal to about 31.25%, an issue of shifted cell voltage distributions is detected, indicating that a read disturb effect occurred. When the read disturb effect is detected, the controller may operate to rectify the read disturb effect, such as through repeated read, relaxed timing conditions, multi-plane read disable, or any other applicable changes in read operation parameters. Alternatively, scanning voltage combs may be altered and shifted in order to accommodate for shifted cell voltage distributions. For example, the controller may be configured to read the voltage state "C" at 2,000 mV. However, because of the verify condition mismatch of the upper page, the controller may read the voltage state "C" at a lower voltage (i.e., a voltage state shift) to account for the distribution shift where the read at the lower voltage is based on the calibrated read threshold. Alternatively, data may be identified as unrecoverable, and memory management of the storage device, such as the controller, may relocate any other recoverable data within the memory block to another memory block. The previous memory block may be retired, such as marking the memory block as "bad", where the controller is configured to avoid sending the data to the "bad" memory block.

Figure 4:
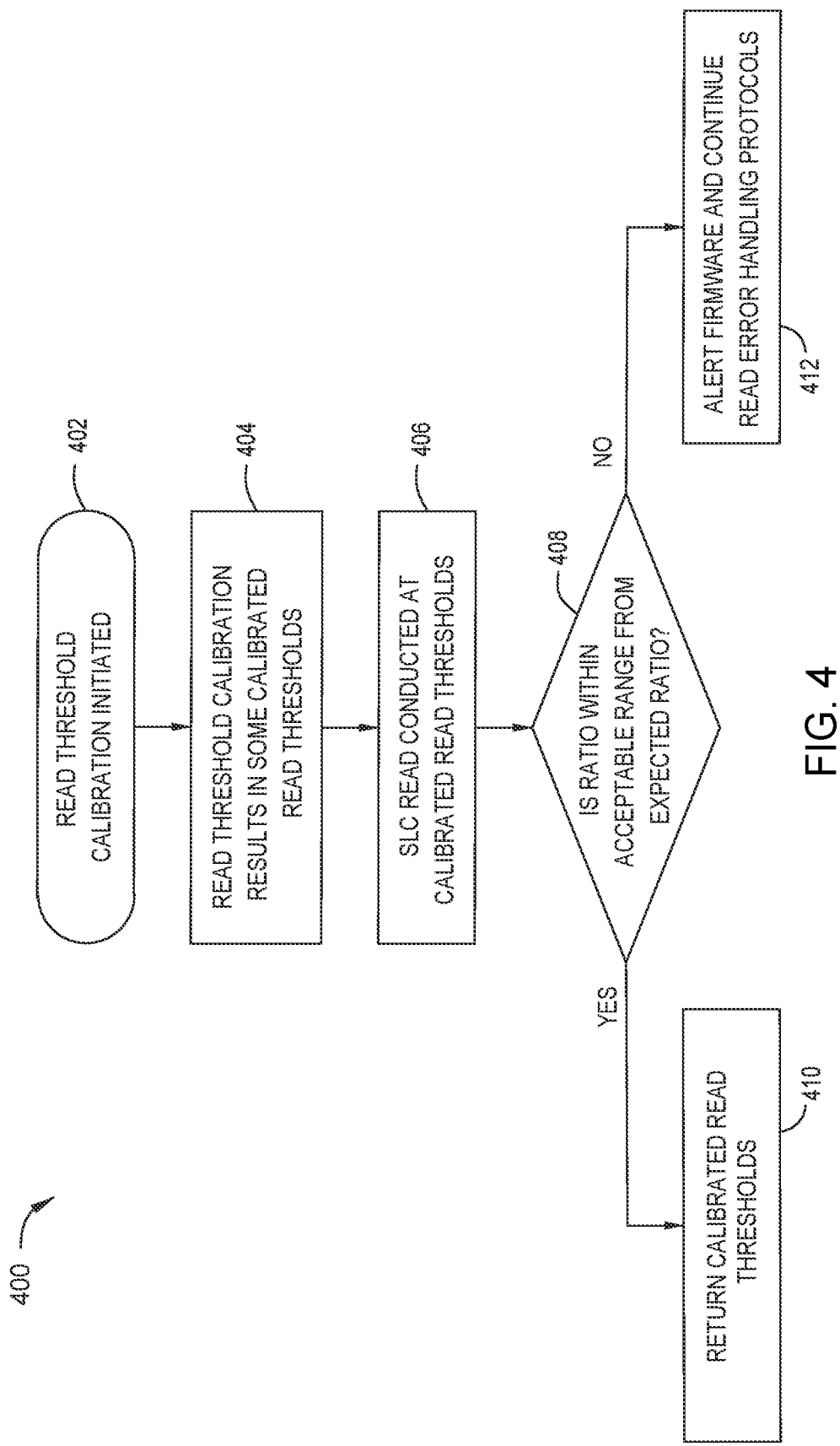
FIG. 4 is a method illustrating an improved read threshold calibration operation, according to disclosed embodiments.

FIG. 4 is a method 400 illustrating an improved read threshold calibration operation, according to disclosed embodiments. At block 402, a read threshold calibration operation is initiated by a controller of a storage device, such as the controller 108 of the storage device 106 of FIG. 1. The read threshold calibration returns calibrated read thresholds based on expected read thresholds of one or more voltage states. At block 404, the controller reads the threshold calibration results for some calibrated read thresholds. For example, the calibrated read thresholds may be the voltage state thresholds for the "Er" to "A" voltage state, the "B" to "C" voltage state, the "D" to "E" voltage state, and/or the "F" to "G" voltage state of FIG. 3. However, because an upper page bit value may be read as a lower page bit value, or vice versa, due to a PF causing a NPD that results in a voltage state distribution shift, a sense operation, such as a SLC read, is conducted at the calibrated read thresholds at block 406. The SLC read may be conducted at the SLC read thresholds described in the Table 1 of FIG. 3. The SLC read determines the bit ratio of a first number of first bits to the total number of bits, where the first number of first bits is the number of cells whose Vt is less than the SLC read level, where the first bits are the number of logical "1's" and the total number of bits is the number of cells. In some embodiments, the first number of first bits is the number of bits read as logical "0's".

At block 408, the controller determines if the bit ratio determined from the SLC read at the different calibrated read thresholds of block 406 are within an acceptable range from the expected ratio. The acceptable range may be a number of standard deviations from the expected ratio. If the ratio is within an acceptable range from the expected ratio at 408, the controller returns the calibrated read thresholds at block 410. However, if the ratio is not within an acceptable range at block 408, then the controller alerts the firmware and continues to read error handling protocols. The read error handling protocols may comprise repeated reads of the page with modified and/or relaxed read operation parameters, adjusting the one or more scanning combs of the read threshold calibration process, relocating the recoverable data from the memory block and retiring the block by marking the block as "bad", or any other appropriate countermeasures.

Figure 5:
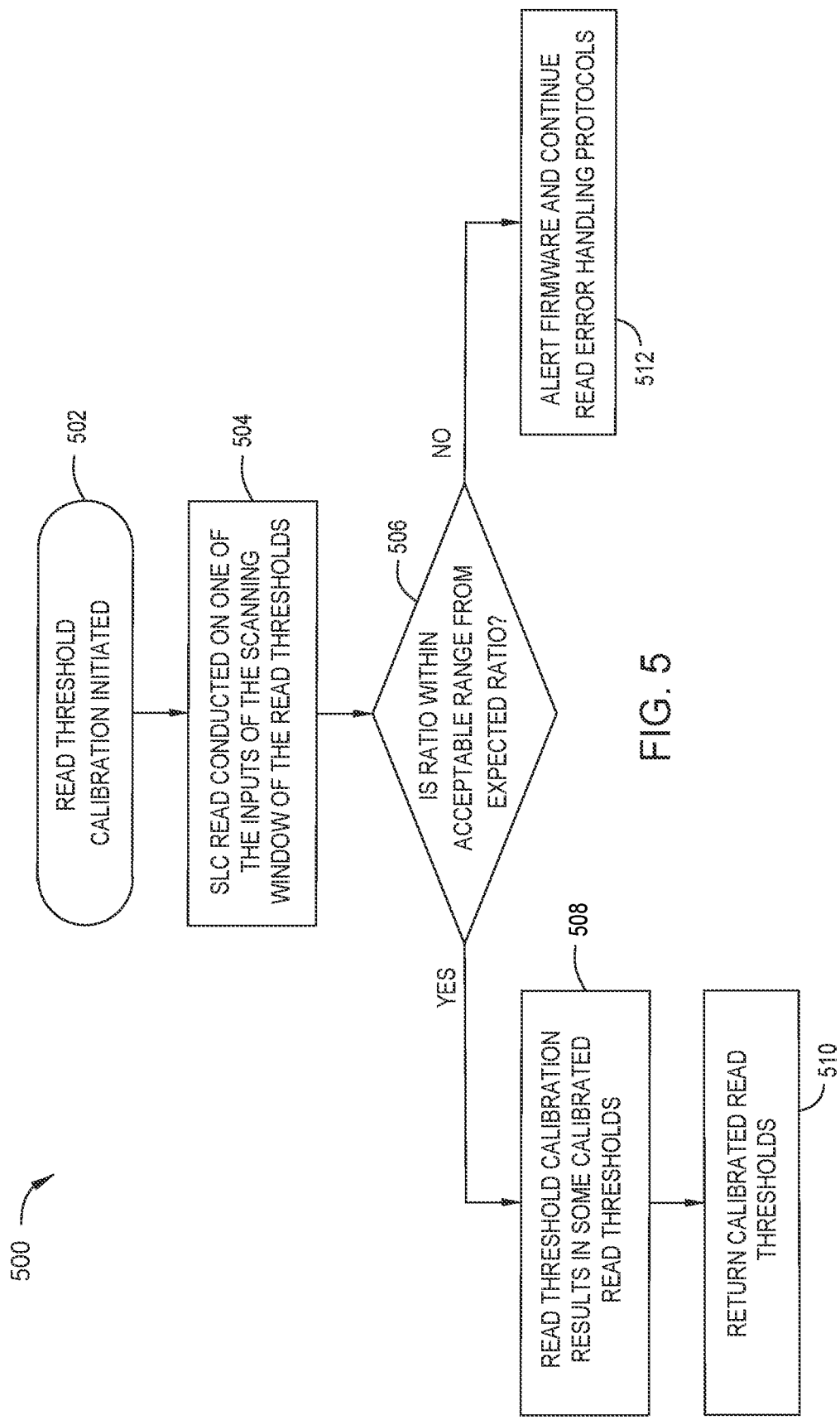
FIG. 5 is a method illustrating an improved read threshold calibration operation, according to disclosed embodiments.

FIG. 5 is a method 500 illustrating an improved read threshold calibration operation, according to disclosed embodiments. Aspects of FIG. 5 may be similar to the method 400 of FIG. 4. At block 502, a read threshold calibration operation is initiated by a controller of a storage device, such as the controller 108 of the storage device 106 of FIG. 1. While the read threshold calibration operation is being performed, a SLC read is conducted on at least one of the inputs of a scanning window of the read thresholds at block 504. The scanning window of the read thresholds corresponds to the potential read thresholds, such as the minimum threshold values and the maximum threshold values described in FIG. 3. The potential read thresholds may be the average read thresholds of many similar memory cells. Furthermore, the read calibration threshold calibration may be avoided if the inputs (i.e., the potential read thresholds) are identified as incorrectly placed. Thus, latency and power consumption may be improved. By conducing the SLC reads while the read threshold calibration operation is occurring, the controller or the firmware may be able to rectify any read threshold calibration operation issues, such as shifted cell voltage distributions, during the read threshold calibration operation or prior to the read threshold calibration operation, rather than after the read threshold calibration operation has completed, such as in method 400.

At block 506, the controller determines if the bit ratio satisfies the verify condition, as indicated in Table 1. If the bit ratio is satisfies the verify condition at block 506, then at block 508, the controller reads the read threshold calibration results in some calibrated read thresholds. For example, the calibrated read thresholds may be the voltage state thresholds for the "Er" to "A" voltage state, the "B" to "C" voltage state, the "D" to "E" voltage state, and/or the "F" to "G" voltage state of FIG. 3. At block 510, the controller returns the calibrated read thresholds. However, if the ratio does not satisfy the verify condition at block 506, then the controller aborts the read threshold calibration operation, alerts the firmware, and continues to read error handling protocols at block 512. The read error handling protocols may comprise repeated reads of the page with modified and/or relaxed read operation parameters, adjusting the one or more scanning combs of the read threshold calibration operations, relocating the recoverable data from the memory block and retiring the memory block as "bad, or any other appropriate countermeasures.

By performing a SLC read at the expected read thresholds to and comparing the resulting binary page statistics to the expected binary page statistics, issues of shifted cell voltage distribution due to some disturb condition may be detected and rectified. Moreover, the read calibration operation avoids finding read thresholds of a wrong page. Thus, the integrity of the data storage device is increased during XOR recovery operations due to program failures, and the storage device is able to meet or exceed demanding data integrity specifications.

In one embodiment, a data storage device comprises a non-volatile storage unit. A capacity of the non-volatile storage unit is divided into a plurality of cells. Each of the plurality of cells includes one or more pages. The data storage device further comprises a controller coupled to the non-volatile storage unit. The controller is configured to sense a statistic of the one or more pages at an expected read threshold, where the sensing is a single-level cell (SLC) read at the expected read threshold, compare the sensed statistic of the one or more pages to an expected statistic of the one or more pages, and adjust, based on a deviation from the expected statistic, a calibrated read threshold of the read threshold calibration.

Each of the one or more pages is an upper page, a middle page, or a lower page. The sensing the statistic of the one or more pages includes sensing a first number of first bit values or a second number of second bit values. The first bit value corresponds to a logical "1" value and the second bit value corresponds to a logical "0" value. The controller is further configured to perform a read threshold calibration operation to provide the expected statistic of the one or more pages, where the expected statistic is a ratio of the first number of the first bits to a total number of bits, and where the total number of bits comprises the first number of first bits and the second number of second bits. The expected statistic is a result of a read threshold calibration operation. The read threshold calibration operation comprises reading one or more expected read thresholds of the one or more voltage states. The adjusting is a read voltage distribution shift in a positive voltage direction or a negative voltage direction to match the sensed statistic In another embodiment, a data storage device comprises a non-volatile storage unit. A capacity of the non-volatile storage unit is divided into a plurality of cells. Each of the plurality of cells includes one or more pages. The data storage device further comprises a controller coupled to the non-volatile storage unit. The controller is configured to initiate a read threshold calibration operation, analyze results of the read threshold calibration operation to determine one or more calibrated read thresholds, sense a ratio of bit values of at least one or more single read thresholds, calculate a statistic, based on the sensing, of the one or more pages, where a sensed statistic is a fraction of a first number of first bit values or a fraction of a second number of second bit values, determine if the sensed statistic is within an acceptable range from an expected statistic, generate an alert if the sensed statistic is outside the acceptable range from the expected statistic, and adjust, based on a deviation from the expected statistic, the one or more calibrated read thresholds of the read threshold calibration operation.

The statistic is a ratio of a first number of first bit values to a total number of bits. The total number of bits includes the first number of first bit values and a second number of second bit values. The first number of bit values is a number of logical "1's" and the second number of bit values is a number of logical "0's". The controller, when the alert is generated, is further configured to perform at least one of the following: repeat the read threshold calibration operation utilizing modified sensing parameters, the modified sensing parameters comprising at least one of relaxing a timing of the read threshold calibration operation and performing a single plane read, adjust one or more scanning combs of the read threshold operation, and relocate recoverable data from the one or more pages. The sensing a ratio of bit values of at least one or more single read thresholds is a single-level cell (SLC) read. The acceptable range is a number of standard deviations. The number of standard deviations is between about 5 and about 10. The deviation from the expected statistic is a read voltage distribution shift in a positive voltage direction or in a negative voltage direction to match the sensed statistic.

In another embodiment, a data storage device comprises a non-volatile storage unit. A capacity of the non-volatile storage unit is divided into a plurality of cells. Each of the plurality of cells includes one or more pages. The data storage device further comprises a controller coupled to the non-volatile storage unit. The controller is configured to sense a statistic of the one or more pages prior to performing a read threshold calibration operation, where the statistic is a ratio of a first number of first bits to a total number of bits, and where the total number of bits comprises the first number of first bits and a second number of second bits, determine if the sensed statistic is within an acceptable range from an expected statistic, generate an alert if the sensed statistic is outside the acceptable range from the expected statistic, where the controller performs, in response to the alert, at least one of the following: repeat the read threshold calibration operation utilizing modified sensing parameters, adjust one or more scanning combs of the read threshold operation, and relocate recoverable data from the one or more pages, and adjust, based on a deviation from the expected statistic, the one or more calibrated read thresholds of the read threshold calibration operation.

The modified sensing parameters includes at least one relaxing a timing of the read threshold calibration operation and performing a single plane read, and where a memory block storing the recoverable data is retired upon the relocation of the recoverable data. The plurality of cells has one or more voltage states, wherein each of the one or more voltage states has a lower scanning comb and an upper scanning comb. The SLC read occurs at either the lower scanning comb or the upper scanning comb of one or more of the voltage states. The lower scanning comb is at a lower threshold of the one or more voltage states and the upper scanning comb is at an upper threshold of the one or more voltage states. The SLC read determines the first number of first bits and the second number of second bits for the one or more pages. The first number of first bits corresponds to a first number of logical "1's" and the second number of second bits corresponds to a second number of logical "0's". The adjusting comprises shifting the one or more calibrated read thresholds in a positive voltage direction or in a negative voltage direction. The shifting matches the one or more calibrated read thresholds to the sensed statistic.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
   a non-volatile storage unit, wherein a capacity of the non-volatile storage unit is divided into a plurality of cells, and wherein each of the plurality of cells comprises one or more pages; and
   a controller coupled to the non-volatile storage unit, wherein the controller is configured to:
      generate a calibrated read threshold for one or more voltage states of a cell of multi-level cell (MLC) for the one or more pages;
      sense a statistic of the one or more pages at an expected read threshold, wherein the sensing is a single-level cell (SLC) read at the expected read threshold;
      compare the sensed statistic of the one or more pages to an expected statistic of the one or more pages; and
      adjust, based on a deviation from the expected statistic, the calibrated read threshold.

2. The data storage device of claim 1, wherein each of the one or more pages is an upper page, a middle page, or a lower page.

3. The data storage device of claim 1, wherein sensing the statistic of the one or more pages comprises sensing a first number of first bit values or a second number of second bit values.

4. The data storage device of claim 3, wherein the first bit value corresponds to a logical "1" value and the second bit value corresponds to a logical "0" value.

5. The data storage device of claim 4, wherein the controller is further configured to perform a read threshold calibration operation to provide the expected statistic of the one or more pages, wherein the expected statistic is a ratio of the first number of the first bits to a total number of bits, and wherein the total number of bits comprises the first number of first bits and the second number of second bits.

6. The data storage device of claim 1, wherein the expected statistic is a result of a read threshold calibration operation, and wherein the read threshold calibration operation comprises reading one or more expected read thresholds of the one or more voltage states.

7. The data storage device of claim 1, wherein the adjusting is a read voltage distribution shift in a positive voltage direction or a negative voltage direction to match the sensed statistic.

8. A data storage device, comprising:
   a non-volatile storage unit, wherein a capacity of the non-volatile storage unit is divided into a plurality of cells, and wherein each of the plurality of cells comprises one or more pages; and
   a controller coupled to the non-volatile storage unit, wherein the controller is configured to:
      initiate a read threshold calibration operation for the one or more pages of a cell of multi-level cell (MLC);
      analyze results of the read threshold calibration operation to determine one or more calibrated read thresholds;
      sense a ratio of bit values of at least one or more single read thresholds for a single-level cell (SLC);
      calculate a statistic, based on the sensing, of the one or more pages, wherein a sensed statistic is a fraction of a first number of first bit values or a fraction of a second number of second bit values;
      determine if the sensed statistic is within an acceptable range from an expected statistic;
      generate an alert if the sensed statistic is outside the acceptable range from the expected statistic; and
      adjust, based on a deviation from the expected statistic, the one or more calibrated read thresholds.

9. The data storage device of claim 8, wherein the statistic is a ratio of a first number of first bit values to a total number of bits, and wherein the total number of bits comprises the first number of first bit values and a second number of second bit values.

10. The data storage device of claim 9, wherein the first number of bit values is a number of logical "1's" and the second number of bit values is a number of logical "0's".

11. The data storage device of claim 8, wherein the controller, when the alert is generated, is further configured to perform at least one of the following:
   repeat the read threshold calibration operation utilizing modified sensing parameters, the modified sensing parameters comprising at least one of relaxing a timing of the read threshold calibration operation and performing a single plane read;
   adjust one or more scanning combs of the read threshold calibration operation; and
   relocate recoverable data from the one or more pages.

12. The data storage device of claim 8, wherein the acceptable range is a number of standard deviations, and wherein the number of standard deviations is between about 5 and about 10.

13. The data storage device of claim 8, wherein the deviation from the expected statistic is a read voltage distribution shift in a positive voltage direction or in a negative voltage direction to match the sensed statistic.

* * * * *